(12) United States Patent
Wang et al.

(10) Patent No.: US 10,516,101 B2
(45) Date of Patent: Dec. 24, 2019

(54) PHYSICAL CLEANING WITH IN-SITU DIELECTRIC ENCAPSULATION LAYER FOR SPINTRONIC DEVICE APPLICATION

(71) Applicant: Taiwan Semiconductor Manufacturing Company, Ltd., Hsinchu (TW)

(72) Inventors: Yu-Jen Wang, San Jose, CA (US); Keyu Pi, San Jose, CA (US); Ru-Ying Tong, Los Gatos, CA (US)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 14/813,854

(22) Filed: Jul. 30, 2015

(65) Prior Publication Data
US 2017/0033282 A1 Feb. 2, 2017

(51) Int. Cl.
*H01L 43/12* (2006.01)
*H01L 43/08* (2006.01)

(52) U.S. Cl.
CPC .................... *H01L 43/12* (2013.01)

(58) Field of Classification Search
None
See application file for complete search history.

(56) References Cited

U.S. PATENT DOCUMENTS

| 6,515,064 B1* | 2/2003 | Tanaka | C08J 5/00 524/496 |
| 7,993,535 B2 | 8/2011 | Jiang et al. | |
| 8,912,012 B2* | 12/2014 | Li | H01L 43/12 257/E21.665 |
| 2009/0314740 A1* | 12/2009 | Ikemoto | H01L 43/12 216/22 |
| 2013/0115719 A1 | 5/2013 | Liou et al. | |
| 2013/0171742 A1* | 7/2013 | Wang | H01L 43/12 438/3 |
| 2014/0264668 A1 | 9/2014 | Lee et al. | |
| 2015/0092482 A1 | 4/2015 | Ha | |
| 2015/0104882 A1 | 4/2015 | Jung et al. | |

FOREIGN PATENT DOCUMENTS

| CN | 104183696 | 12/2014 |
| EP | 1 926 158 | 5/2008 |

OTHER PUBLICATIONS

PCT Search Report, Application No. PCT/US2016/044437, Applicant: Headway Technologies, Inc., dated Nov. 3, 2016, 29 pgs.

* cited by examiner

*Primary Examiner* — Alexander G Ghyka
(74) *Attorney, Agent, or Firm* — Haynes and Boone, LLP

(57) ABSTRACT

A method for etching a magnetic tunneling junction (MTJ) structure is described. A stack of MTJ layers is provided on a bottom electrode in a substrate. The MTJ stack is etched to form a MTJ structure wherein portions of sidewalls of the MTJ structure are damaged by the etching. Thereafter, the substrate is removed from an etching chamber wherein sidewalls of the MTJ structure are oxidized. A physical cleaning of the MTJ structure removes damaged portions and oxidized portions of the MTJ sidewalls. Thereafter, without breaking vacuum, an encapsulation layer is deposited on the MTJ structure and bottom electrode.

16 Claims, 4 Drawing Sheets

PHYSICAL CLEANING WITH IN-SITU DIELECTRIC ENCAPSULATION LAYER FOR SPINTRONIC DEVICE APPLICATION

TECHNICAL FIELD

This disclosure relates to the general field of magnetic tunneling junctions (MTJ) and, more particularly, to improved methods for forming MTJ structures.

BACKGROUND

This disclosure relates to the field of Magnetic Devices, and such devices include, but are not limited to: (1) various designs of Magnetic Random Access Memory (MRAM), e.g., In-plane or Out-of-plane (PMA) Spin-Torque-Transfer (STT) RAM, (2) various designs of Spin Valve read head or sensor, and (3) other Spintronic devices.

For spin torque applications, the dry etching process of MTJ fabrication will be very critical to the MTJ performance. There are some potential concerns induced by MTJ etching processes such as the following: (A) Sidewall damage during MTJ etching, and (B) Oxidation of sidewall in between the process from MTJ etching to the encapsulated layer deposition (with vacuum broken). These kinds of damage will be more critical as MRAM technology goes toward the 45 nm node or smaller.

In the meantime, this kind of sidewall damage layer around the MTJ is believed to be a chemically unstable layer. The thermal treatment of the semiconductor BEOL (back end of line) process will enhance the sidewall damage due to atom diffusion from the sidewall which will dramatically degenerate MTJ performance.

The present disclosure provides an improved method to fabricate the STT-RAM or related spintronic device with a combination of plasma treatment and in-situ encapsulation layer after the conventional MTJ RIE etching process.

Several patents show cleaning and in-situ deposition. These include U.S. Pat. No. 7,993,535 (Jiang et al), U.S. Pat. No. 8,912,012 (Li et al), and 2014/0263668 (Lee et al).

SUMMARY

It is an object of the present disclosure to provide improved spin-transfer efficiency in a STT-RAM or related spintronic device by combining physical cleaning and an in-situ encapsulation layer.

Yet another object of the present disclosure is to provide an improved MTJ structure by removing damage and/or oxidized sidewalls by physical cleaning, then encapsulating the cleaned MTJ structure without breaking vacuum.

In accordance with the objectives of the present disclosure, a method for etching a magnetic tunneling junction (MTJ) structure is achieved. A stack of MTJ layers is provided on a bottom electrode in a substrate. The MTJ stack is etched to form a MTJ structure wherein portions of sidewalls of the MTJ structure are damaged by the etching. Thereafter, the substrate is removed from an etching chamber wherein sidewalls of the MTJ structure are oxidized. A physical cleaning of the MTJ structure removes damaged portions and oxidized portions of the MTJ sidewalls. Thereafter, without breaking vacuum, an encapsulation layer is deposited on the MTJ structure and bottom electrode.

BRIEF DESCRIPTION OF THE DRAWINGS

In the accompanying drawings forming a material part of this description, there is shown.

DETAILED DESCRIPTION

In a traditional MTJ etching process, a hard mask (metal or oxide) is formed, followed by MTJ etching by reactive ion etching (RIE). After the MTJ etching process, the wafer will be unloaded from the etcher tool and exposed to the atmosphere. The MTJ sidewall can be damaged either during the etching process or by exposure to the atmosphere causing oxidation on the sidewall. This is generally called sidewall damage. It will lead to lower magnetic ratio (MR) and worse magnetic properties such as lower coercivity (Hc), lower energy barrier (Eb), higher critical writing current (Ic), and higher critical writing voltage (Vc), and also will induce non-uniformity of electric and magnetic performance. Sidewall damage caused by oxidation will get worse especially when MTJ size decreases to a diameter of <150 nm.

In this disclosure, we introduce a new scheme for protecting the MTJ by a dielectric encapsulation layer without a sidewall damaged layer. Sidewall damage caused during the etching process or by exposing the MTJ sidewall to the atmosphere can be removed by applying a physical cleaning process, which might be plasma cleaning or ion-beam-etching to remove the sidewall oxidation/damage layer. After the physical cleaning process, an encapsulation dielectric layer will be deposited on the MTJ structure without breaking vacuum when transferring the wafer from the physical cleaning module to the encapsulation deposition module. By combining the physical cleaning process and in-situ dielectric encapsulation process, the sidewall damage layer can be minimized or removed completely.

Figure 1A:
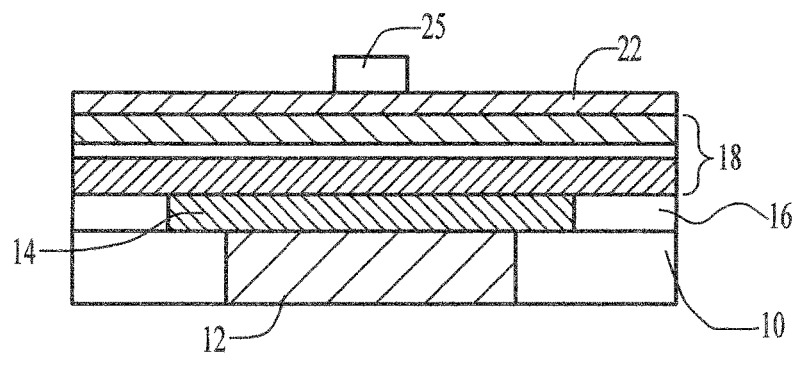
FIGS. 1A through 1F illustrate in cross-sectional representation steps in a preferred embodiment of the present disclosure.

The combination physical cleaning process and in-situ dielectric encapsulation process of the present disclosure will be described in more detail with reference to FIGS. 1A-1F. Referring now more particularly to FIG. 1A, there is shown semiconductor substrate 10 in which is formed metal contact 12, such as copper. Bottom electrode 14 is formed on the top surface of the substrate and surrounded by dielectric layer 16. A MTJ stack 18 is deposited on top of the bottom electrode. A hard mask layer 22 is deposited on the MTJ stack. The hard mask layer may be a metal or an oxide, for example. A photoresist mask 25 is formed on the hard mask layer.

Figure 1B:
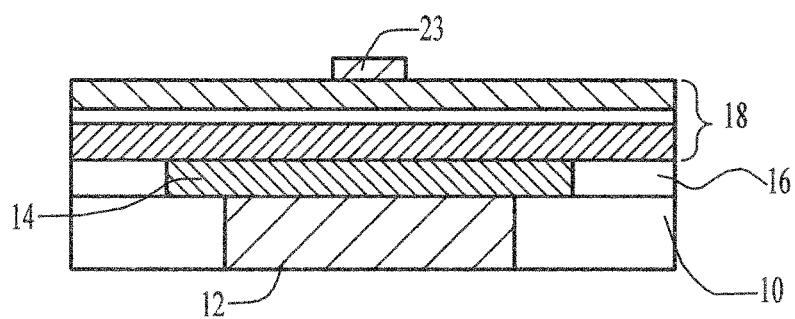
Figure 1C:
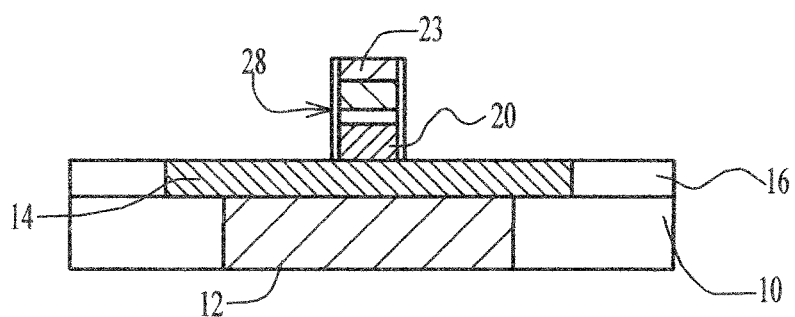
Figure 1D:
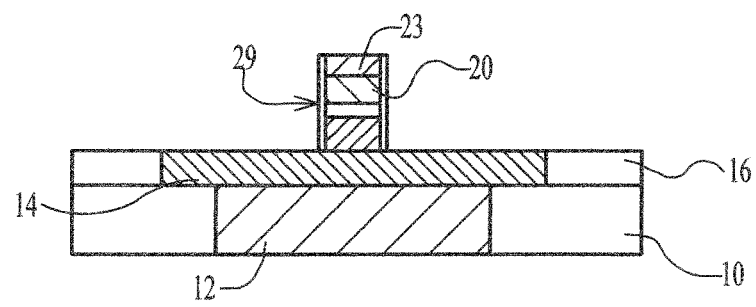

Referring now to FIG. 1B, the hard mask layer is etched away where it is not covered by the photoresist mask 25 to form a hard mask 23. Now, the MTJ stack is etched using the hard mask 23. For example, the etching can be by RIE using $CH_3OH$ or $CO/NH_3$ etching gases. MTJ device 20 is formed by the etching process, as shown in FIG. 1C. 28 on the sidewalls of the MTJ device indicates sidewall damage caused by the etching process.

Now, the wafer is removed from the etching chamber. When the wafer is exposed to the atmosphere, the sidewall damage is oxidized as indicated by 29 in FIG. 1D. If an encapsulant layer is now deposited over the MTJ device, the sidewall damage is also capped by this layer.

In a key step of the present disclosure, a physical cleaning process is performed on the MTJ followed by an in-situ encapsulation layer deposition without breaking vacuum or exposing the wafer to any other gas contamination. The physical cleaning could be performed by (A) Plasma cleaning or (B) Ion Beam Etching with nitrogen, argon, or other non-reactive gas. For achieving a good cleaning performance, the substrate stage can be tilted between about 25°~85° (angle in reference to the incoming incident beam) according to the pitch size. The substrate stage might be rotated to achieve decent uniformity.

The physical cleaning process will remove the sidewall damaged layer 28/29. For example, this process will remove the equivalent of about 5 A~150 A SiOx on a $SiO_2$ blanket wafer, and preferably 50 A SiOx equivalent.

Figure 1E:
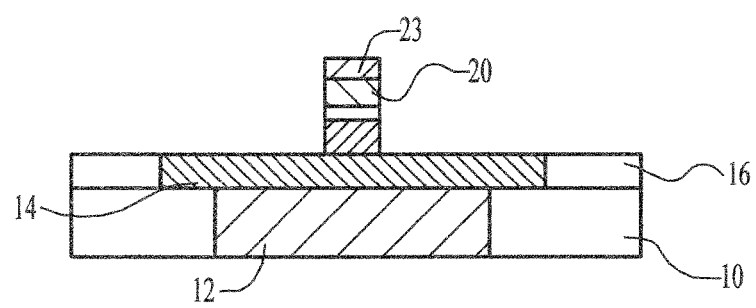
Figure 1F:
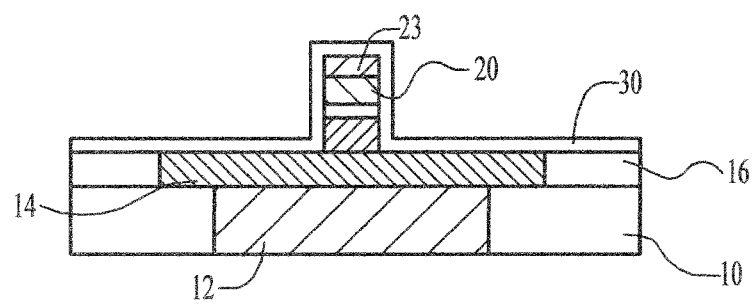

FIG. 1E shows the MTJ device 20 after the damaged sidewalls have been removed. Now, deposition of the encapsulation layer is performed after the physical cleaning process without a vacuum break. The encapsulation layer 30, shown in FIG. 1F, is deposited by physical vapor deposition (PVD), such as sputtering or ion beam deposition (IBD), chemical vapor deposition (CVD), or atomic layer deposition (ALD). The material of the encapsulation layer could be alloys of oxide and nitride, which are insulators and are able to sustain high temperature processes of up to 400° C., for example. Some possible materials are: $Si_3N_4$, SiON, $SiO_2$, AlN, AlON, SiC, SiCN, $MgO_x$, $AlO_x$ or laminations of one or more of the aforementioned dielectric layers. For example, $Si_3N_4$ is a preferred encapsulation layer. The encapsulation thickness is between about 30 and 5000 Angstroms and preferably 50 to 500 Angstroms.

Figure 2A:
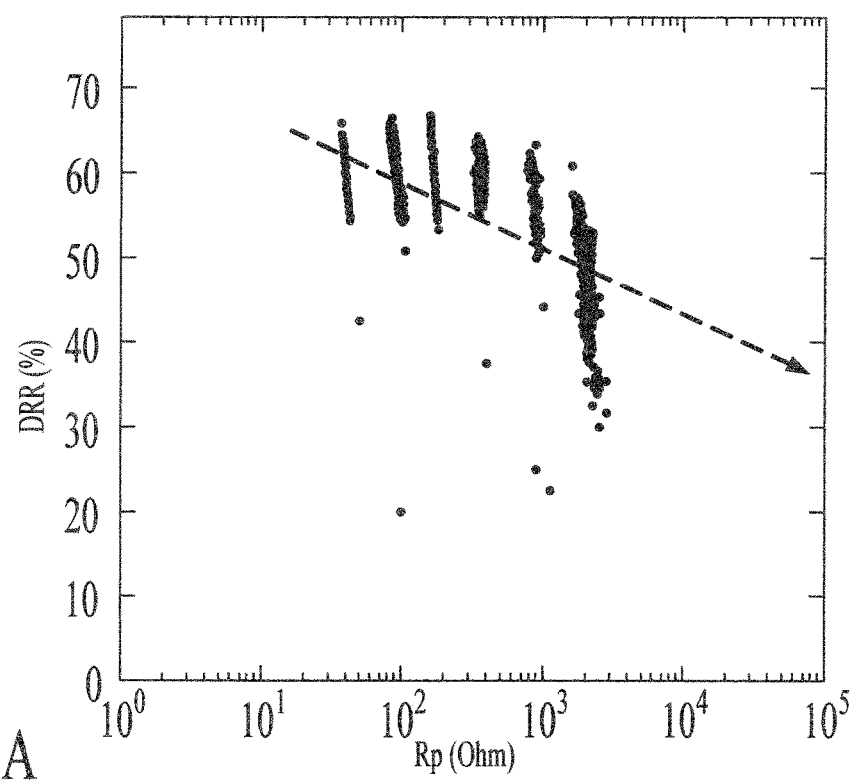
FIGS. 2A and 2B are graphical illustrations of resistance vs. magnetoresistance in a conventional process and in the preferred embodiment of the present disclosure, respectively.
Figure 2B:
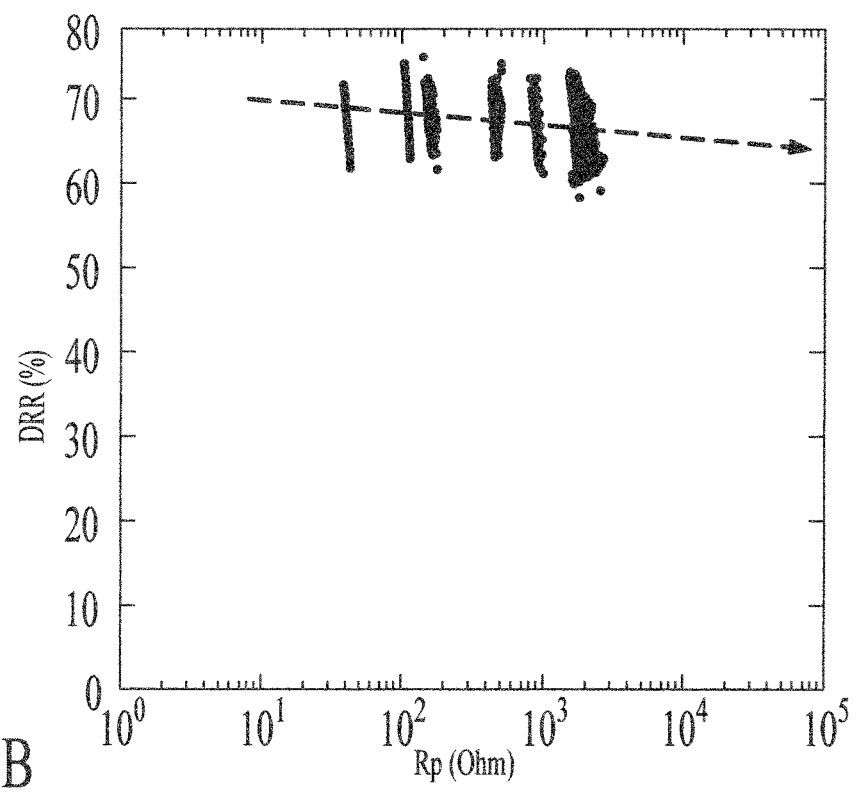

The advantage of this process can be observed in FIG. 2. The horizontal axis shows the resistance Rp of the junction. A higher Rp value represents a smaller MTJ size. On the vertical axis is magnetoresistance (DRR %). FIG. 2A illustrates the graph of DRR % as a function of resistance of magnetic tunnel junctions fabricated without the combination physical cleaning and in-situ encapsulation of the present disclosure. As can be seen in FIG. 2A, magnetoresistance (DRR %) will drop with decreasing MTJ size since the sidewall damage will be more serious as MTJ size decreases. On the other hand, no size (Rp) dependence of DRR % is shown in FIG. 2B showing MTJ's fabricated according to the process of the disclosure, specifically the combination physical cleaning and in-situ encapsulation. This proves that the sidewall damage will be removed or suppressed by the disclosed process.

Figure 3A:
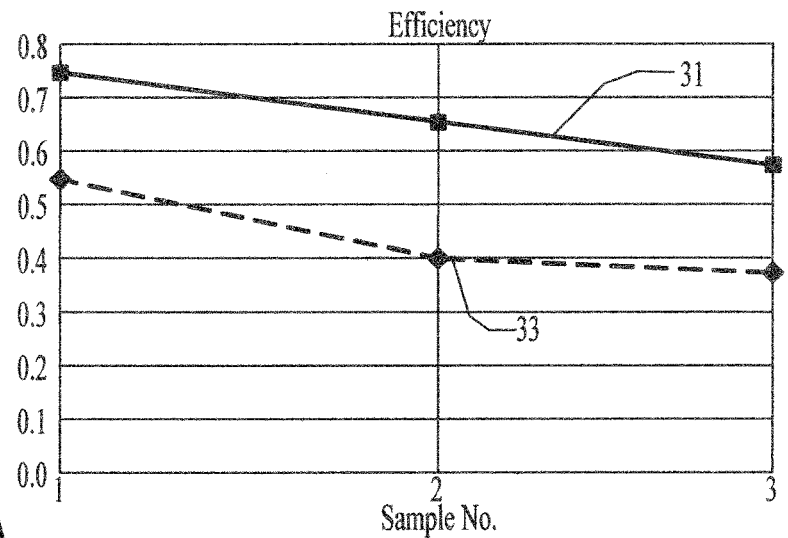
FIG. 3A is a graphical illustration of spin efficiency in a conventional process and in the preferred embodiment of the present disclosure.
Figure 3B:
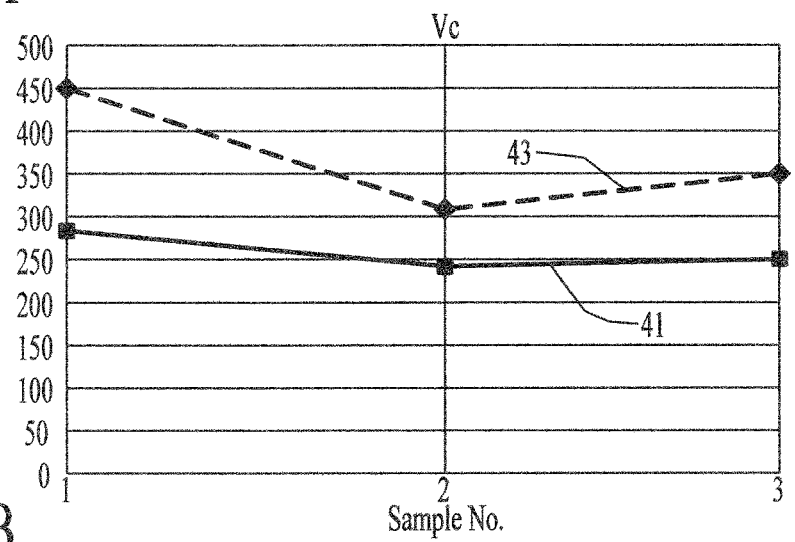
FIG. 3B is a graphical illustration of critical writing voltage in a conventional process and in the preferred embodiment of the present disclosure.
Figure 3C:
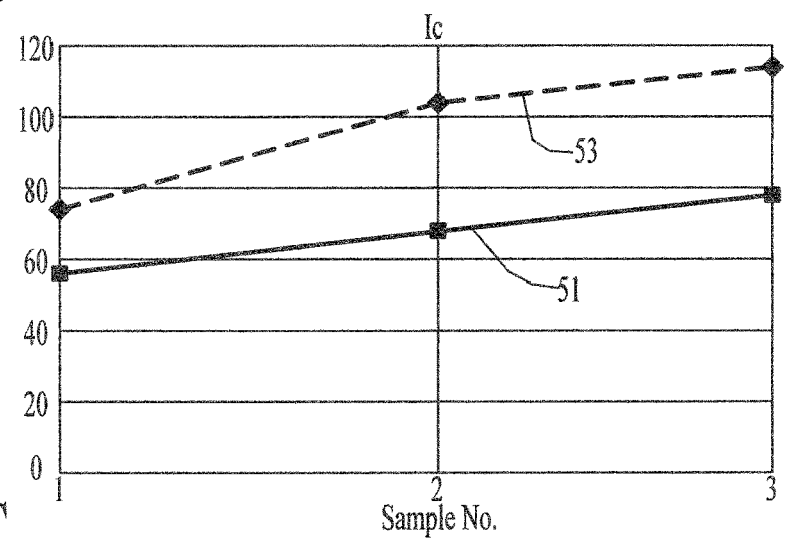
FIG. 3C is a graphical illustration of critical writing current in a conventional process and in the preferred embodiment of the present disclosure.

This process will not only improve the size dependence of DRR %, but also increase the spin transfer efficiency as shown in FIG. 3. As shown in the FIG. 3A, the spin transfer efficiency for three samples is shown for the traditional process by line 33 and for the disclosed process by line 31. Spin transfer efficiency is seen to increase dramatically for the samples fabricated by the combination physical cleaning and in-situ encapsulation process. FIG. 3B shows critical writing voltage (Vc) for the traditional process 43 and the disclosed process 41. FIG. 3C shows critical writing current (Ic) for the traditional process 53 and the disclosed process 51. It can be seen that both Vc and Ic are reduced due to the increase of spin efficiency. The increase of spin efficiency could be explained by the removal of the sidewall damage layer since the sidewall damage layer is believed to be leaky and also has short spin diffusion length.

The size dependence of DRR % is always observed if the traditional MTJ etching process is performed without the combination physical cleaning and in-situ encapsulation of this disclosure. The DRR % will drop as the MTJ size decreases. To maintain the DRR % for the small MTJ size (diameter <150 nm) will be a key issue for STT-MRAM products. With the disclosed process, the DRR % could be maintained without MTJ size dependence due to the removal of the sidewall damaged layer. The spin torque transfer efficiency also could be enhanced and a much lower Vc and Ic also could be achieved.

The present disclosure provides a method of improved spin transfer efficiency and DRR % for the MTJ device by combining physical cleaning and in-situ encapsulation layer. This process could be used for MTJ devices with in-plane/out-of-plane or/partial out-of-plane anisotropy for embedded memory applications in, e.g., embedded high-density PMA Spin-Torque-Transfer (STT) MRAM.

Although the preferred embodiment of the present disclosure has been illustrated, and that form has been described in detail, it will be readily understood by those skilled in the art that various modifications may be made therein without departing from the spirit of the disclosure or from the scope of the appended claims.

What is claimed is:

1. A method for fabricating a magnetic tunneling junction (MTJ) structure, the method comprising:
   providing a stack of MTJ layers on a bottom electrode, the bottom electrode being laterally surrounded by a dielectric layer;
   patterning the stack of MTJ layers to form a MTJ structure, the patterning including using carbon monoxide and ammonia as etching gases, the patterning exposing the dielectric layer and a top surface of the bottom electrode;
   thereafter removing the MTJ structure from an etching chamber, wherein sidewalls of the MTJ structure are damaged;
   thereafter performing a plasma cleaning with a non-reactive gas on the MTJ structure, wherein a damaged portion of the sidewalls is removed; and
   thereafter, without breaking vacuum, depositing an encapsulation layer on the MTJ structure, the encapsulation layer physically contacting the dielectric layer and the bottom electrode.

2. The method according to claim 1, further comprising:
   forming a hard mask on the MTJ stack, wherein
   patterning the MTJ stack includes using the hard mask as an etching mask, wherein the hard mask comprises metal or oxide or a combination of the two.

3. The method according to claim 1, wherein the MTJ stack is etched using reactive ion etching, wherein sidewalls of the MTJ stack are damaged by the etching, and wherein after removing the MTJ structure from the etching chamber, the sidewalls are oxidized as a result of exposure to an atmosphere thereby causing further sidewall damage.

4. The method according to claim 1, wherein the depositing the encapsulation layer is performed by physical vapor deposition, chemical vapor deposition, or atomic layer deposition.

5. The method according to claim 1, wherein the depositing the encapsulation layer is performed by sputtering or ion beam deposition.

6. The method according to claim 1, wherein the encapsulation layer is capable of sustaining high temperature processes of up to 400° C.

7. The method according to claim 6, wherein the encapsulation layer includes a material selected from the group consisting of $Si_3N_4$, SiON, $SiO_2$, AlN, AlON, SiC, SiCN, $MgO_X$, $AlO_X$, and combinations thereof.

8. The method according to claim 1, wherein a thickness of the encapsulation layer is in a range from about 30 Angstroms to about 5000 Angstroms.

9. The method according to claim 1, wherein the MTJ structure is part of an MTJ device with in-plane, out-of-plane, or partial out-of-plane anisotropy for embedded memory applications.

10. The method according to claim 8, wherein the thickness of the encapsulation layer is in a range from about 50 Angstroms to about 500 Angstroms.

11. The method according to claim 1, wherein the patterning including using carbon monoxide and ammonia as etching gases includes a reactive ion etching process.

12. A method, comprising:
providing a semiconductor substrate including a metal contact;
forming a dielectric layer over the semiconductor substrate;
forming a bottom electrode in the dielectric layer, the bottom electrode being disposed on the metal contact and being laterally surrounded by the dielectric layer;
forming a magnetic tunneling junction (MTJ) material stack on the bottom electrode;
etching the MTJ material stack in an etching chamber using carbon monoxide and ammonia as etchant gases to thereby form an MTJ device structure, the etching further forming damaged sidewall portions of the MTJ device structure;
removing, subsequent to the etching, the MTJ device structure from the etching chamber;
subsequent to the removing, performing a physical cleaning process on the MTJ device structure in a vacuum environment to remove the damaged sidewall portions of the MTJ device structure; and
subsequent to the physical cleaning process, encapsulating the MTJ device structure in an insulating material while maintaining the vacuum environment.

13. The method according to claim 12, wherein the physical cleaning process includes a plasma cleaning process.

14. The method according to claim 12, wherein the physical cleaning process includes an ion beam cleaning process with an inert gas.

15. The method according to claim 14, wherein the insulating material includes a material selected from the group consisting of $Si_3N_4$, SiON, $SiO_2$, AlN, AlON, SiC, SiCN, $MgO_X$, $AlO_X$, and combinations thereof.

16. The method according to claim 12, wherein removing, subsequent to the etching, the MTJ device structure from the etching chamber includes exposing the MTJ device structure having the damaged sidewall portions to an atmosphere that causes further sidewall damage to the MTJ device structure.

* * * * *